United States Patent
Schnell (10) Patent No.: US 8,946,650 B2
(45) Date of Patent: Feb. 3, 2015

(54) PARTICLE BEAM DEVICE AND METHOD FOR ANALYZING AND/OR TREATING AN OBJECT

(75) Inventor: Michael Schnell, Lorch (DE)

(73) Assignee: Carl Zeiss Microscopy GmbH, Jena (DE)

(*) Notice: Subject to any disclaimer, the term of this patent is extended or adjusted under 35 U.S.C. 154(b) by 0 days.

(21) Appl. No.: 13/239,577

(22) Filed: Sep. 22, 2011

(65) Prior Publication Data

US 2012/0080594 A1    Apr. 5, 2012

(30) Foreign Application Priority Data

Sep. 30, 2010   (DE) .................... 10 2010 041 813

(51) Int. Cl.
*H01J 37/12*    (2006.01)
*H01J 37/063*   (2006.01)
*H01J 37/26*    (2006.01)
*H01J 37/21*    (2006.01)

(52) U.S. Cl.
CPC ............... *H01J 37/26* (2013.01); *H01J 37/21* (2013.01); *H01J 2237/04735* (2013.01); *H01J 2237/057* (2013.01); *H01J 2237/2802* (2013.01)
USPC ...................... 250/398; 350/396 R (58) Field of Classification Search
CPC ........... H01J 3/14; H01J 3/18; H01J 37/02; H01J 37/04; H01J 37/063; H01J 37/10; H01J 37/12; H01J 37/21; H01J 37/26; H01J 37/261; H01J 37/295; H01J 2237/049; H01J 2237/0492; H01J 2237/04924; H01J 2237/04735; H01J 2237/057; H01J 2237/2802
USPC ............... 250/396 R–396 ML, 306, 307, 311
See application file for complete search history.

(56) References Cited

U.S. PATENT DOCUMENTS

| | | | | |
|---|---|---|---|---|
| 4,383,180 | A | * | 5/1983 | Turner .................... 250/492.2 |
| 4,814,716 | A | | 3/1989 | Kato et al. |
| 5,013,913 | A | | 5/1991 | Benner |
| 5,519,216 | A | * | 5/1996 | Benner et al. ................ 250/311 |
| 6,040,576 | A | | 3/2000 | Benner |
| 6,323,485 | B1 | | 11/2001 | Tsuno |
| 6,495,826 | B2 | | 12/2002 | Tsuno |

(Continued)

FOREIGN PATENT DOCUMENTS

| | | | |
|---|---|---|---|
| DE | 3825 103 | A1 | 1/1990 |
| DE | 196 33 496 | A1 | 2/1998 |

(Continued)

OTHER PUBLICATIONS

G. Benner, et al., Design and First Results of SESAM, Microscopy and Microanalysis 9 (2003), 66-67.

*Primary Examiner* — Nicole Ippolito
*Assistant Examiner* — David E Smith
(74) *Attorney, Agent, or Firm* — Muirhead and Saturnelli, LLC (57) ABSTRACT

A particle beam device and a method for analyzing and/or treating an object is disclosed. According to the described system, the position of a crossover on an optical axis of a particle beam device can be freely adjusted, even in the case of a fixed extractor potential and a fixed high voltage. The particle beam device has a first electrode unit with three electrode apparatuses, a second electrode unit with three electrode apparatuses, and an acceleration unit. The method according to the system described herein uses the particle beam device.

26 Claims, 7 Drawing Sheets

(56) References Cited

U.S. PATENT DOCUMENTS

| | | |
|---|---|---|
| 6,531,698 B1 | 3/2003 | Benner |
| 6,770,878 B2 | 8/2004 | Uhlemann et al. |
| 2003/0098414 A1 | 5/2003 | Uhlemann et al. |
| 2003/0127595 A1 | 7/2003 | Nakamura et al. |
| 2007/0181805 A1 | 8/2007 | Mori et al. |
| 2008/0135777 A1* | 6/2008 | Yamashita et al. ............ 250/397 |
| 2008/0290273 A1* | 11/2008 | Uhlemann .................... 250/305 |
| 2009/0218508 A1 | 9/2009 | Tamura et al. |
| 2009/0256082 A1* | 10/2009 | Nakashima ............... 250/396 R |
| 2011/0079731 A1* | 4/2011 | Kim .......................... 250/396 R |

FOREIGN PATENT DOCUMENTS

| | | |
|---|---|---|
| DE | 199 45 344 A1 | 3/2001 |
| DE | 19945344 A1 * | 3/2001 |
| DE | 10 2007 024 353 A1 | 11/2008 |
| EP | 0899771 A2 | 3/1999 |
| EP | 1 277 221 B1 | 5/2004 |

* cited by examiner

PARTICLE BEAM DEVICE AND METHOD FOR ANALYZING AND/OR TREATING AN OBJECT

TECHNICAL FIELD

This application relates to a particle beam device and a method for analyzing and/or treating an object.

BACKGROUND OF THE INVENTION

Particle beam devices for analyzing and/or treating an object are known from the prior art. More particularly, electron beam devices, for example scanning electron microscopes (referred to as SEM below) or transmission electron microscopes (referred to as TEM below), are known.

A particle beam generator is used in a particle beam device for generating a particle beam. By way of example, an electron beam generator is used in a TEM for generating an electron beam. In order to obtain a high resolution, it is known to limit chromatic errors generated by components of the TEM. To this end, the energy width of the electrons of the electron beam is reduced in the prior art. More precisely, the electrons of the electron beam, which emerge from the electron beam generator, are filtered using a monochromator unit. The monochromator unit only lets those electrons of the electron beam pass into the further beam path of the TEM that only have a small deviation from a predeterminable energy. The electrons, which are filtered using the monochromator unit and subsequently enter the further beam path of the TEM, are then accelerated using an acceleration unit situated downstream from the monochromator unit.

The prior art has disclosed a three-part design of an electron beam generator for a TEM. Thus, this known electron beam generator comprises an electron emitter, a suppressor electrode and an extractor electrode. Moreover, the TEM has an electrode unit that is connected between the electron beam generator and the monochromator unit. The electrode unit is used to focus an electron beam, which was generated by the electrode beam generator, into a specific geometrically fixed plane of the monochromator unit. Hence the electrode unit acts in a focusing fashion. Furthermore, it likewise has a three-part design. Thus, the electrode unit has a first electrode apparatus, a second electrode apparatus and a third electrode apparatus, wherein the second electrode apparatus is connected between the first electrode apparatus and the third electrode apparatus. The first electrode apparatus is embodied as the extractor electrode of the electron beam generator. Hence the extractor electrode is both a component of the electron beam generator and a component of the electrode unit. In the known electrode unit, the third electrode apparatus is embodied in the form of an exit electrode. The exit electrode is both a component of the electrode unit and a first component of the monochromator unit. In this design of the electrode unit, both the extractor electrode and the exit electrode lie at the potential of the extractor electrode (also called extractor potential).

Electrons of the electron beam pass through the monochromator unit along a non-straight axis of the monochromator unit. The electrons respectively form a crossover at one or more points within the monochromator unit. Above, and also below, a crossover is understood to be a position on an axis, e.g. the optical axis of a particle beam device, at which the particles (the electrons in the case of a TEM) emitted by the particle emitter (e.g. the electron beam generator) converge and a cross-sectional area of the particle beam accordingly has a local minimum. In order to be able, along the optical axis of the TEM, to select, in respect of type and design, the components, e.g. electrode and acceleration units, that are arranged downstream or upstream of the monochromator unit in respect of the beam path of the electrons, it is sufficient to know the position (location) of a crossover on the input side of the monochromator unit and the position (location) of a crossover on the output side of the monochromator unit. The input side of the monochromator unit is the side from which electrons enter into the monochromator unit. The output side of the monochromator unit is the side from which electrons exit the monochromator unit. Here, the crossover on the input side and the crossover on the output side of the monochromator unit lie on an axis of a straight-line equivalent beam path of the monochromator unit. Here, the straight-line equivalent beam path does not run along the actual non-straight axis of the monochromator unit but rather is the beam path that the electrons would pass through if there were no monochromator unit but the electrons were to experience the same effect as in the monochromator unit. The crossover on the input side and the crossover on the output side of the monochromator unit are virtual.

The electrode unit serves to focus an electron beam, generated by the electron beam generator, onto a specific geometrically fixed plane of the crossover on the input side of the monochromator unit. In order to bring this about, the prior art has disclosed the practice of applying a specific potential to the second electrode apparatus for a predetermined extractor potential at the extractor electrode. After the electrons have exited the monochromator unit, the electrons are accelerated to a desired energy in an acceleration unit in the further beam path of the TEM. As a result of the potential profile in the acceleration unit the acceleration unit has a fixed focusing effect for a specific electron energy. It is for this reason that the virtual crossover on the output side of the monochromator unit (a first crossover) is imaged at a specific position on the optical axis of the TEM after the electron beam passes through the acceleration unit. There is a real second crossover at this specific position, namely the image of the virtual crossover on the output side of the monochromator unit. In the prior art, the position of the second crossover is prescribed by a selected high voltage, by which the desired energy of the electrons is obtained, and by a predetermined extractor voltage. If the high voltage changes (i.e. if the desired energy of the electrons changes) and/or if the extractor voltage changes, the position of the second crossover also changes.

It is known that the focusing effect of the acceleration unit is determined firstly by the potential drop between an exit electrode, lying at the extractor potential, of the monochromator unit and a first acceleration electrode of the acceleration unit and secondly by the potential drop between the first acceleration electrode and a second acceleration electrode in the acceleration unit. However, the potential drop between the exit electrode, lying at the extractor potential, of the monochromator unit and the first acceleration electrode of the acceleration unit mainly contributes to the focusing effect of the acceleration unit. This has to do with the fact that the relative increase in the electron energy (with respect to the energy at the extractor electrode) when the electrons pass through the path between the extractor electrode and the acceleration unit is greatest between the extractor electrode and the first acceleration electrode. Here, the relative increase in energy is understood to mean a change in energy between two of the aforementioned electrodes with respect to the energy at a first electrode.

The position of the second crossover depends on the fixing of the extractor potential, on the first acceleration potential applied to the first acceleration electrode (i.e. also on the high voltage determining the energy of the electrons) and on the second acceleration potential applied to the second acceleration electrode. Different positions of the second crossover on the optical axis emerge depending on the extractor potential and depending on the high voltage determining the energy of the electrons. Hence, these different positions are fixedly prescribed as a result of the selected extractor potential and the high voltage determining the electron energy and cannot be varied.

In respect of the aforementioned prior art, reference is made to DE 196 33 496 A1, U.S. Pat. No. 6,495,826 B2 and EP 1 277 221 B1, which are incorporated herein by reference.

Accordingly, it would be desirable to specify a particle beam device and a method, in which the position of a crossover on an optical axis of a particle beam device can be freely adjusted, even in the case of a fixed extractor potential and a fixed high voltage.

SUMMARY OF THE INVENTION

According to the system described herein a particle beam device for analyzing and/or treating an object has an optical axis and at least one particle beam generator for generating a particle beam. By way of example, the particle beam device is embodied as a TEM and the particle beam generator is embodied as an electron beam generator. The particle beam device according to the system described herein has at least a first electrode unit, which has at least a first electrode apparatus, at least a second electrode apparatus and at least a third electrode apparatus, wherein arranged in the direction of an object, starting from the particle beam generator along the optical axis, there firstly is the first electrode apparatus, subsequently there is the second electrode apparatus and once again subsequently there is the third electrode apparatus. The first electrode apparatus lies at a first potential and is embodied to extract particles from the particle beam generator. By contrast, the second electrode apparatus lies at a variable second potential. Accordingly, the second potential can be selected and freely adjusted. The third electrode apparatus in turn lies at the first potential, i.e. at the same potential as the first electrode apparatus.

In addition to the first electrode unit, the particle beam device according to the system described herein has at least a second electrode unit, which has at least a fourth electrode apparatus, at least a fifth electrode apparatus and at least a sixth electrode apparatus, wherein arranged in the direction of an object, starting from the third electrode apparatus along the optical axis, there firstly is the fourth electrode apparatus, subsequently there is the fifth electrode apparatus and once again subsequently there is the sixth electrode apparatus. The fourth electrode apparatus—like the first electrode apparatus—lies at the first potential. By contrast, the fifth electrode apparatus lies at a variable third potential. Accordingly the third potential can be selected and freely adjusted.

Furthermore, the particle beam device according to the system described herein has at least one acceleration unit for accelerating the particles in the particle beam. The acceleration unit has at least a first acceleration apparatus and at least a second acceleration apparatus, wherein arranged in the direction of an object, starting from the second electrode unit along the optical axis, there firstly is the first acceleration apparatus and subsequently there is the second acceleration apparatus. The first acceleration apparatus lies at a fourth potential. By contrast, the second acceleration apparatus lies at a fifth potential. The fourth potential of the first acceleration apparatus and the fifth potential of the second acceleration apparatus are predetermined by a high voltage, which is used to bring the particles, for example the electrons, to a specific energy.

The system described herein is based on the following deliberations: as a result of the adjustability of the third potential of the fifth electrode apparatus, a further option is obtained for adjusting the position of a crossover of the particle beam on the optical axis. Surprisingly it was found that this adjustment of the crossover can be carried out substantially independently of the overall voltage of the acceleration unit and the extractor potential. Expressed differently, the crossover can be positioned at any desired point on the optical axis in the beam path, following the acceleration unit, of the particle beam device by varying the third potential of the fifth electrode apparatus; this is always possible, for any value of the overall voltage of the acceleration unit, for example for any value of the overall voltage between approximately 20 kV and approximately 300 kV, and for any value of the extractor potential, for example for any value of the extractor potential between approximately 2 kV and 7 kV.

In one embodiment of the particle beam device according to the system described herein, provision is alternatively or additionally made for the first acceleration apparatus to be embodied as the sixth electrode apparatus. Hence the first acceleration apparatus is both part of the second electrode unit and part of the acceleration unit. Additionally or alternatively to this, provision is made for the sixth electrode apparatus to lie at a variable sixth potential. The variable sixth potential may correspond to the fourth potential. The adjustability of the sixth potential provides a further option for adjusting the position of a crossover on the optical axis.

In a further embodiment in turn of the particle beam device according to the system described herein, the particle beam device additionally or alternatively has at least one monochromator unit. More particularly, provision is made for the monochromator unit to have at least a first monochromator electrode apparatus and at least a second monochromator electrode apparatus. Arranged in the direction of an object, starting from the first electrode unit along the optical axis, there firstly is the first monochromator electrode apparatus and subsequently there is the second monochromator electrode apparatus. However, the system described herein is not restricted to a monochromator unit with only two monochromator electrode apparatuses. Rather, provision is also made for exemplary embodiments in which there are more than two monochromator electrode apparatuses in the monochromator unit. As already explained above, the monochromator unit only lets those particles in the particle beam pass into the further beam path of the particle beam device that only have a small deviation from a prescribable energy. This will be discussed in more detail below.

Furthermore, provision is additionally or alternatively made for the particle beam device according to the system described herein to have at least one of the following features:
the third electrode apparatus is embodied as a monochromator input electrode, or
the fourth electrode apparatus is embodied as a monochromator output electrode.

In the process, the monochromator input electrode lies on an input side of the monochromator unit, i.e. on the side from which the particles enter the monochromator unit. By contrast, the monochromator output electrode lies on an output side of the monochromator unit, i.e. on the side from which the particles exit the monochromator unit into the further beam path of the particle beam device. By way of example, the first monochromator input electrode and/or the second monochromator output electrode is/are formed in the form of an aperture unit. In this exemplary embodiment provision is also made for two elements to be associated with two different units of the particle beam device. Expressed differently, provision is for example made for the third electrode apparatus to be both part of the first electrode unit and part of the monochromator unit. Furthermore, provision is for example made for the fourth electrode apparatus to be both part of the second electrode unit and part of the monochromator unit.

In a further embodiment of the particle beam device according to the system described herein, provision is additionally or alternatively made for the fifth potential of the second acceleration apparatus to be configured to be variable. Additionally or alternatively to this, provision is furthermore made for the acceleration unit to have at least a third acceleration apparatus, at least a fourth acceleration apparatus and at least a fifth acceleration apparatus, wherein arranged in the direction of an object, starting from the second acceleration apparatus along the optical axis, there firstly is the third acceleration apparatus, subsequently there is the fourth acceleration apparatus and once again subsequently there is the fifth acceleration apparatus. The third acceleration apparatus lies at a seventh potential. By contrast, the fourth acceleration apparatus lies at an eighth potential and the fifth acceleration apparatus lies at a ninth potential. By way of example, provision is made for the seventh potential, the eighth potential and/or the ninth potential to be configured to be variable. The aforementioned exemplary embodiments allow a particularly suitable adjustment of an acceleration energy provided for the particles of the particle beam. In the process, the potential difference between two adjacent acceleration apparatuses may always be selected such that desired focusing by the acceleration unit is ensured. The potential difference between the individual adjacent acceleration apparatuses can be constant or else be different.

Reference is explicitly made to the fact that the system described herein is not restricted to the aforementioned number of acceleration apparatuses. Rather, any suitable number of acceleration apparatuses is usable.

In a further embodiment in turn of the particle beam device according to the system described herein, provision is additionally or alternatively made for the particle beam device to have at least one condenser unit, wherein the condenser unit has one of the following features:

at least a first condenser apparatus and at least a second condenser apparatus,
 at least a first condenser apparatus, at least a second condenser apparatus and at least a third condenser apparatus, or
 at least a first condenser apparatus, at least a second condenser apparatus, at least a third condenser apparatus and at least a fourth condenser apparatus.

Reference is explicitly made to the fact that the system described herein is not restricted to a condenser unit with the aforementioned numbers of condenser apparatuses. Rather, any suitable number of condenser apparatuses is usable.

The aforementioned condenser unit is more particularly provided for allowing the particle beam to impinge on an object, parallely to the optical axis. Provision is additionally or alternatively made for the condenser unit to be used to adjust the illumination field. An illumination field is understood to mean the dimensions of a region of an object illuminated by a particle beam. Expressed differently, these are the dimensions of the region of an object on which the particle beam impinges. Again additionally or alternatively to this, provision is made for the condenser unit to be used to adjust the illumination aperture. Here, the illumination aperture is understood to mean the aperture angle of the cone of the particle beam that is routed to the object for illumination purposes (i.e. the cone of the particle beam impinging on the object).

In a further embodiment in turn of the particle beam device according to the system described herein, provision is additionally or alternatively made for the first electrode apparatus to be embodied as extractor electrode apparatus of the particle beam generator. Hence the first electrode apparatus in this exemplary embodiment is both part of the first electrode unit and part of the particle beam generator.

As already mentioned above, the particle beam device according to the system described herein is for example embodied as a TEM. However, reference is explicitly made to the fact that the particle beam device according to the system described herein is not restricted to a TEM. Rather any suitable particle beam device, for example an ion beam device, is usable.

The system described herein also relates to a method for analyzing and/or treating an object using a particle beam device that has at least one of the aforementioned features or a combination of at least two of the aforementioned features. A particle beam is generated using the particle beam generator in the particle beam device according to the system described herein. The particle beam is subsequently focused in a plane perpendicular to the optical axis or onto the optical axis using the first electrode unit by selecting the second potential. By way of example, this plane is arranged in the monochromator unit. Moreover, the particle beam is focused on a predeterminable point on the optical axis by selecting the third potential. The method will be explained in more detail below.

BRIEF DESCRIPTION OF THE DRAWINGS

Using figures, the system described herein will now be explained in more detail on the basis of exemplary embodiments. In the figures.

DETAILED DESCRIPTION OF VARIOUS EMBODIMENTS

Figure 1:
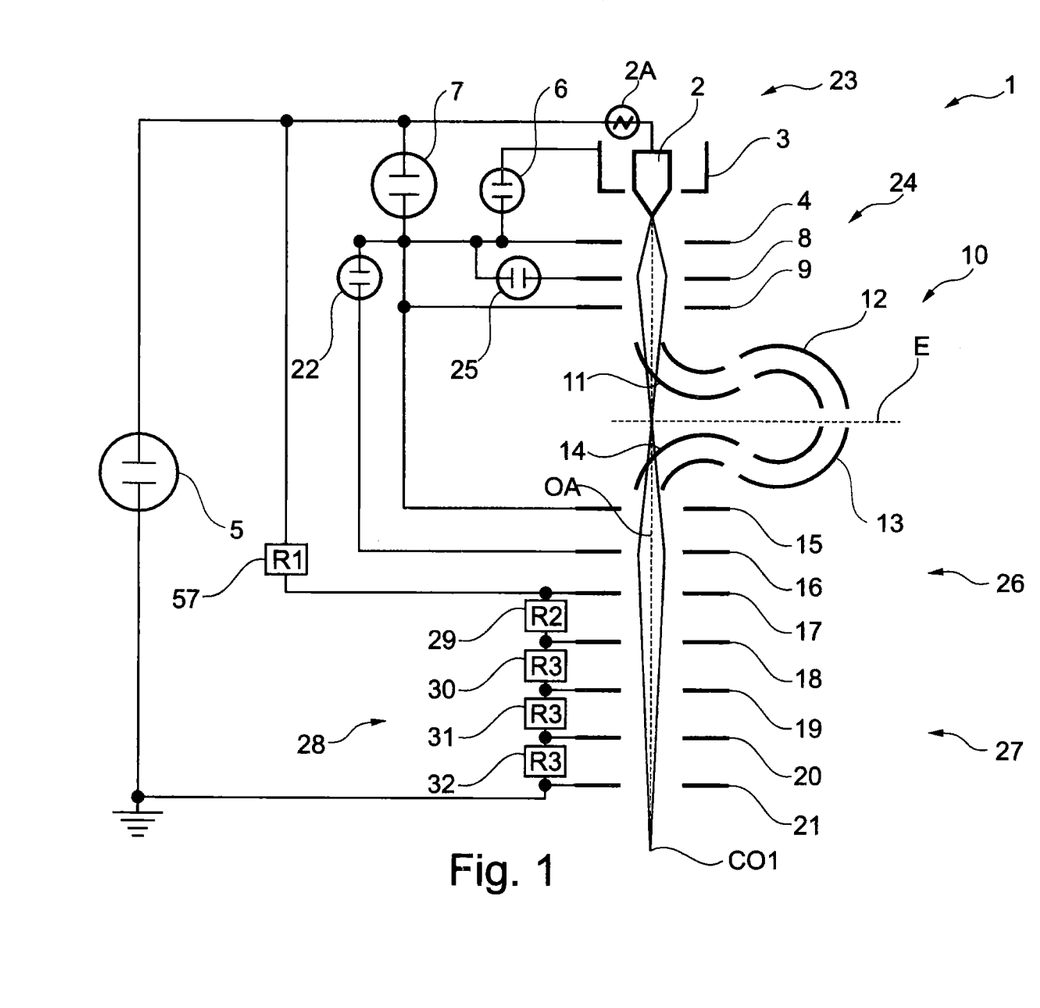
FIG. 1 shows a schematic view of a first section of a particle beam device in the form of a TEM according to an embodiment of the system described herein.

FIG. 1 shows a schematic illustration of a first section of a particle beam device 1 in the form of a TEM according to an embodiment of the system described herein. The first section of the particle beam device 1 comprises an electron beam generator 23, which has an electron emitter 2. By way of example, the electron emitter 2 is embodied as a field-emission emitter. Furthermore, the electron emitter 2 is connected to a heating apparatus 2A. Moreover, the electron beam generator 23 has a suppressor electrode 3 and an extractor electrode 4. Hence the electron beam generator 23 has a three-part design. The electron emitter 2 is connected to a first supply unit 5 (a high-voltage supply unit) for providing an emitter potential. Furthermore, the suppressor electrode 3 is connected to a second supply unit 6 for providing a suppressor potential. Moreover, the extractor electrode 4 is connected to a third supply unit 7 in order to provide an extractor potential at the extractor electrode 4. The electron beam generator 23 is used to generate a particle beam, which consists of electrons and is routed along an optical axis OA of the particle beam device 1 in the direction of an object.

Downstream of the electron beam generator 23 there is a first electrode unit 24, which likewise has a three-part design. The first electrode unit 24 firstly has a first electrode apparatus in the form of the extractor electrode 4. Hence the extractor electrode 4 is both part of the electron beam generator 23 and part of the first electrode unit 24. In the following text, the extractor potential is also referred to as a first potential. Furthermore, the first electrode unit 24 has a second electrode apparatus 8 and a third electrode apparatus 9. The second electrode apparatus 8 is arranged between the extractor electrode 4 and the third electrode apparatus 9. The second electrode apparatus 8 is connected to a fifth supply unit 25 in order to provide a variable second potential. Accordingly, the second potential is freely selectable and adjustable. The third electrode apparatus 9 is connected to the third supply unit 7 and—like the extractor electrode 4—lies at the first potential in the form of the extractor potential.

Downstream of the electrode unit 24 there is a monochromator unit 10. The monochromator unit 10 is composed of a plurality of elements. One of the elements is an input electrode in the form of the third electrode apparatus 9. Hence the third electrode apparatus 9 is both part of the second electrode unit 24 and part of the monochromator unit 10. Furthermore, the monochromator unit 10 is provided with a first monochromator electrode apparatus 11, a second monochromator electrode apparatus 12, a third monochromator electrode apparatus 13 and a fourth monochromator electrode apparatus 14, which are arranged in the shape of an Omega. Moreover, the monochromator unit 10 has an exit electrode 15, which is arranged behind the fourth monochromator electrode apparatus 14. The exit electrode 15—like the extractor electrode 4—is connected to the third supply unit 7 and lies at the first potential in the form of the extractor potential.

Arranged behind the monochromator unit 10 there is a second electrode unit 26, which, in the embodiment illustrated here, has a three-part design. Thus, the second electrode unit 26 has a fourth electrode apparatus in the form of the exit electrode 15. Hence the exit electrode 15 is both part of the second electrode unit 26 and part of the monochromator unit 10. Moreover, the second electrode unit 26 has a fifth electrode apparatus 16, which is connected to a fourth supply unit 22 for providing a variable third potential. Accordingly, the third potential of the fifth electrode apparatus 16 is freely selectable and adjustable. The second electrode unit 26 furthermore has a sixth electrode apparatus 17.

Arranged behind the second electrode unit 26 there is an acceleration unit 27, which, in the embodiment illustrated here, is composed of five acceleration apparatuses, namely a first acceleration apparatus in the form of the sixth electrode apparatus 17, a second acceleration apparatus 18, a third acceleration apparatus 19, a fourth acceleration apparatus 20 and a fifth acceleration apparatus 21. Hence the sixth electrode apparatus 17 is both part of the second electrode unit 26 and part of the acceleration unit 27. The individual aforementioned acceleration apparatuses 17 to 21 are interconnected via a resistance chain 28 and are supplied via the first supply unit 5 (the high-voltage supply unit). Hence there firstly is a first resistor 57. Furthermore, a second resistor 29 is connected between the first acceleration apparatus in the form of the sixth electrode apparatus 17 and the second acceleration apparatus 18. A third resistor 30 is connected between the second acceleration apparatus 18 and the third acceleration apparatus 19. A fourth resistor 31 is in turn connected between the third acceleration apparatus 19 and the fourth acceleration apparatus 20. Furthermore, a fifth resistor 32 is connected between the fourth acceleration apparatus 20 and the fifth acceleration apparatus 21. Individual or a number of the aforementioned resistors (by way of example, even all of them) can be configured to be variable. In the exemplary embodiment illustrated here, the first resistor 57 and the second resistor 29 are embodied in a fixed fashion and different from one another such that a specific potential profile of the acceleration unit 27 is provided along the optical axis OA. The third resistor 30, the fourth resistor 31 and the fifth resistor 32 are the same and not embodied in a variable fashion. More particularly, provision is made for changing and adjusting the potentials at the individual acceleration apparatuses 17 to 21 by adjusting the first supply unit 5 and hence by adjusting the provided high voltage. In a further embodiment of the system described herein provision is made for the first resistor 57 and the second resistor 29 to be embodied in a variable fashion. The potentials at the individual acceleration apparatuses can be modified and adjusted by adjusting the resistance values of the first resistor 57 and/or the second resistor 29. By way of example, the emitter potential is (−200) kV, the extractor potential is (−196) kV, the potential at the sixth electrode apparatus 17 is (−175) kV, the potential at the second acceleration apparatus 18 is (−150) kV, the potential at the third acceleration apparatus is (−100) kV, the potential at the fourth acceleration apparatus 20 is (−50) kV and the potential at the fifth acceleration apparatus 21 is 0 kV. It is possible to see that the potential differences between the individual acceleration apparatuses are not the same, but differ. However, provision is also made for embodiments of the system described herein in which at least two of the potential differences or even all of the potential differences between the individual acceleration apparatuses have the same magnitude.

In the following text, the function and the effect of the individual elements of the first section of the particle beam device 1 is now discussed.

Suitably adjusting the second potential at the second electrode apparatus 8 using the fifth supply unit 25 renders it possible to focus the electron beam in a plane E in the monochromator unit 10 as per the equivalent beam path illustrated in FIG. 1. However, the electrons do not run along the equivalent beam path but rather run along a non-straight axis of the monochromator unit 10. Electrostatic deflection fields are now provided in the first monochromator electrode apparatus 11, the second monochromator electrode apparatus 12, the third monochromator electrode apparatus 13 and the fourth monochromator electrode apparatus 14 such that the monochromator unit 10 only lets electrons of the electron beam with a predeterminable energy pass into the further beam path of the particle beam device 1, which passed electrons only have a small deviation from a predeterminable energy. The energy width of the predeterminable energy is adjusted by a variable slit diaphragm and may for example lie in the region between 0.05 eV and 0.7 eV. This reduces optical aberration and increases the possible resolution of the particle beam device 1.

The monochromator unit 10 has a first plane (not illustrated in FIG. 1) on the input side of the monochromator unit 10 (i.e. on the side on which the electrons enter the monochromator unit 10), which is stigmatically imaged in a second plane (likewise not illustrated in FIG. 1) on the output side of the monochromator unit 10 (i.e. on the side on which the electrons exit the monochromator unit 10) using the electron-optical components of the monochromator unit 10. The first plane and the second plane lie along the paths of the electrons in the monochromator unit 10 and have a spacing that differs from zero. The electron beam emitted by the electron emitter 2 is routed through the first electrode unit 24 such that a crossover plane of the electron beam is formed in the aforementioned first plane. Hence the aforementioned first plane represents a crossover plane on the input side of the monochromator unit 10. Since this first plane is imaged stigmatically in the aforementioned second plane by the electron-optical components of the monochromator unit 10, the second plane represents a crossover plane on the output side of the monochromator unit 10. Depending on the design of the monochromator unit 10, there may be further stigmatic or astigmatic crossover planes in the beam path between the crossover plane on the input side of the monochromator unit and the crossover plane on the output side of the monochromator unit 10. In the equivalent beam path illustrated in FIG. 1, the beam path has, in a simplified fashion, been illustrated as if the crossover plane on the input side of the monochromator unit 10 and the crossover plane on the output side of the monochromator unit 10 would coincide in the plane E.

The electrons are accelerated in the acceleration unit 27 such that they obtain a desired acceleration energy. Now, in the process, the potential drop between the first acceleration apparatus in the form of the sixth electrode apparatus 17 and the further acceleration apparatuses 18 to 21 is now selected such that the electron beam is focused on a position of the optical axis OA, which position is firstly arranged downstream of the acceleration unit 27 and secondly is situated below an actually desired position of the electron beam on the optical axis OA. This is made possible by virtue of the fact that the potential difference between the fourth electrode apparatus 15 and the first acceleration apparatus in the form of the sixth electrode apparatus 17 and the potential difference between the first acceleration apparatus in the form of the sixth electrode apparatus 17 and the second acceleration apparatus 18 is less than the further potential differences between the further aforementioned acceleration apparatuses.

Now, the electron beam is influenced by adjusting the third potential at the fifth electrode apparatus 16 of the second electrode unit 26 using the fourth supply unit 22 to the effect that the electron beam moves along the optical axis OA in the direction of the electron beam generator 23 to the desired position and remains there. A crossover CO1 of the electron beam is now obtained at the desired position.

Figure 2:
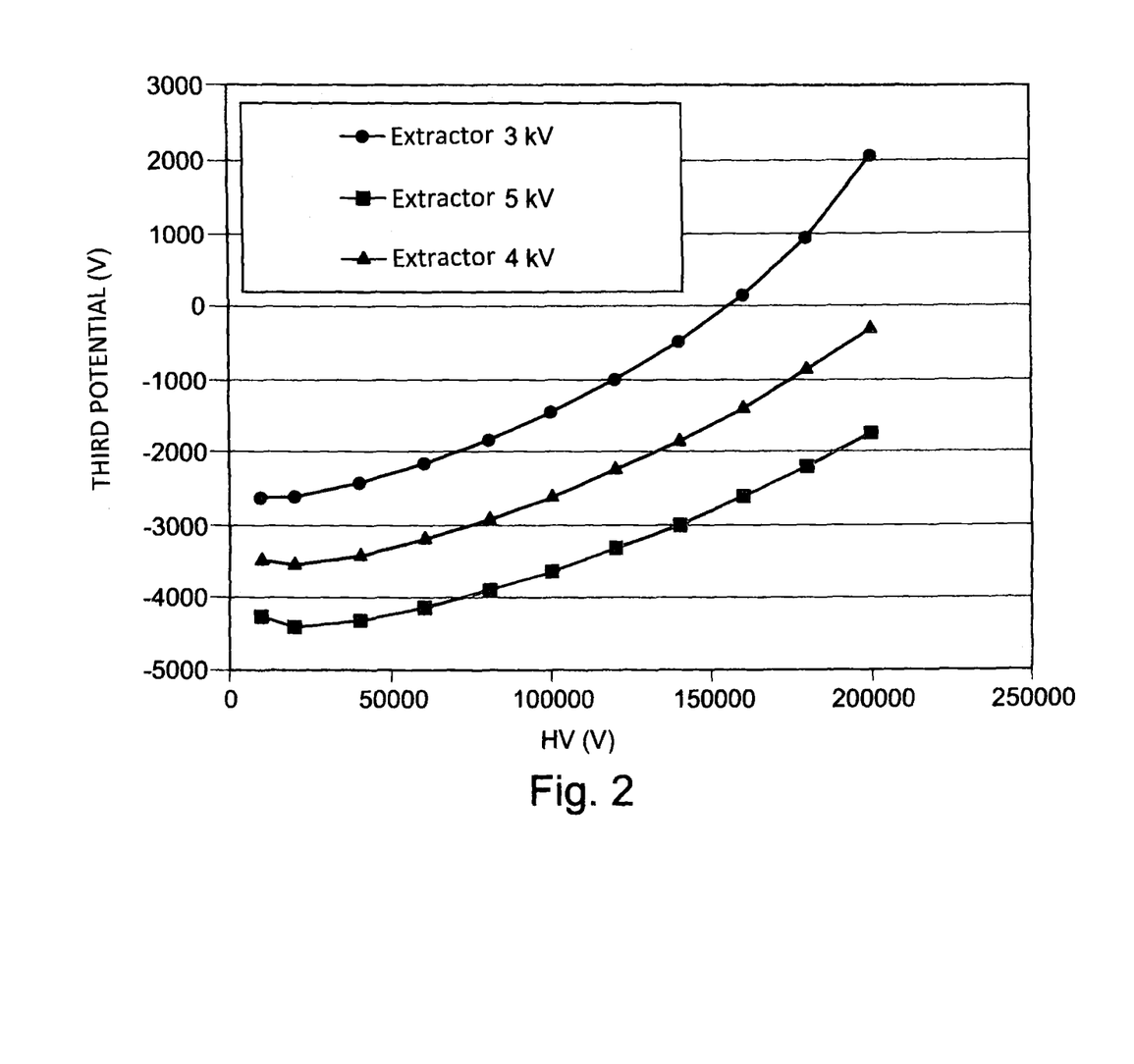
FIG. 2 shows a schematic illustration of values of a third potential as a function of the electron energy according to an embodiment of the system described herein.

Hence it is possible to use the first section of the particle beam device 1 to place the crossover CO1 of the electron beam to any desired position on the optical axis OA or else to leave it at the desired position in the case of occurring changes in the extractor potential or the electron energy. The potentials required for this are suitably selected dependent on the extractor potentials and electron energy. FIG. 2 shows possible values for the third potential of the fifth electrode apparatus 16 as a function of the electron energy (specified by the high voltage HV) and possible extractor potentials. The points interconnected by lines respectively specify, for a given extractor potential as a parameter, which third potential is required so that, dependent on the electron energy, the position of the crossover plane along the optical axis OA remains stationary. One can gather that, for a given position of the crossover plane, it is possible to find a suitable third potential for each extractor potential in the range between 3 kV and 5 kV and for each electron energy between 10 kV and 200 kV such that the crossover is generated in the predetermined crossover plane.

Figure 3:
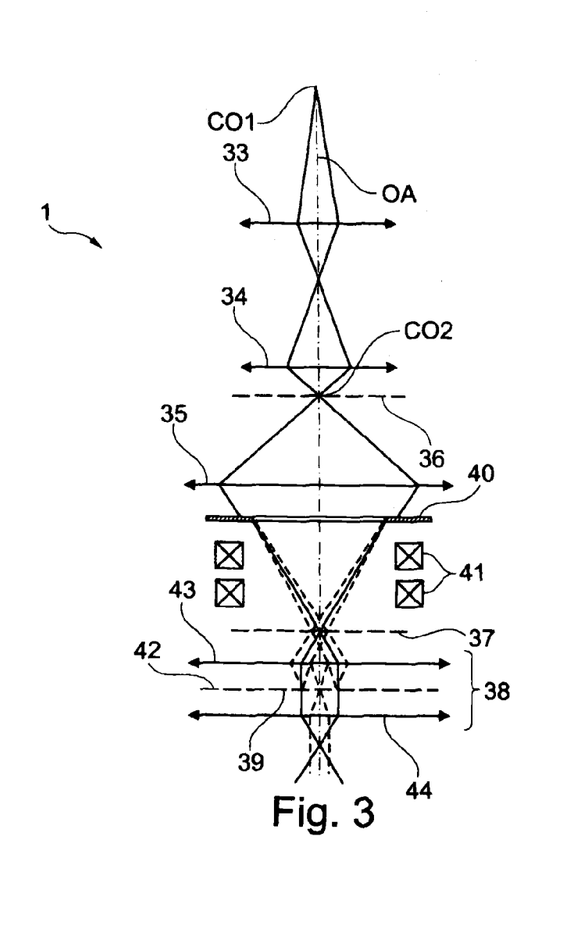
FIG. 3 shows a schematic illustration of a second section of the particle beam device according to FIG. 1.

FIG. 3 shows an exemplary embodiment of a second section of the particle beam device 1 that adjoins the crossover CO1 (cf. FIG. 1). The crossover CO1 is imaged in a demagnified fashion using a condenser unit. To this end, the condenser unit has a first condenser apparatus 33, a second condenser apparatus 34 and a third condenser apparatus 35. In the process, the first condenser apparatus 33 and the second condenser apparatus 34 are actuated such that an image of the crossover CO1, namely a crossover CO2, is generated in a crossover plane 36. The crossover CO2 is now imaged in a focal plane 37 of a single-field condenser-objective lens 38 using the third condenser apparatus 35. The single-field condenser-objective lens 38 has a pre-field lens unit 43 and an imaging lens unit 44. An object 39, which is arranged in an object plane 42, is now illuminated by an electron beam that is aligned parallel to the optical axis OA. This is particularly advantageous in the high-resolution mode of the particle beam device 1.

An illumination field aperture 40 is arranged between the third condenser apparatus 35 and the single-field condenser-objective lens 38. The dimensions of the illuminated region on the object 39 are determined by the diameter of the illumination field aperture 40 and the demagnification using the single-field condenser-objective lens 38. In the exemplary embodiment illustrated here, the electron beam, which determines the dimensions of the illumination aperture, has its narrowest cross section in the focal plane 37 such that a change in the illumination field on the object 39 by the illumination field aperture 40 has no influence on the illumination aperture. A deflection system is arranged in front of the single-field condenser-objective lens 38. The deflection system 41 serves for correcting small deviations of the electron beam with respect to the optical axis OA.

In order only to illuminate a specific area of the object 39 for a large magnification range of the particle beam device 1, provision is made for the illumination field aperture 40 to have a plurality of different aperture openings. A desired aperture opening can be adjusted automatically.

Figure 4:
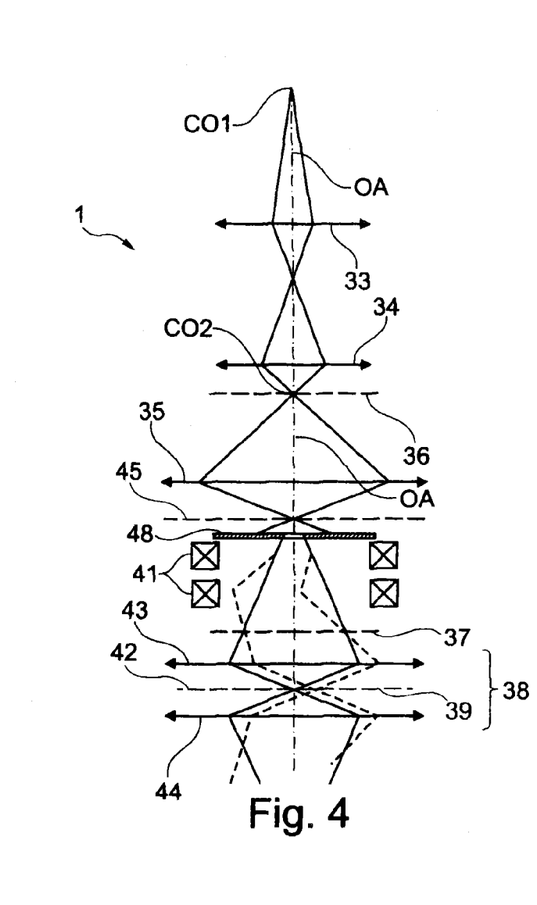
FIG. 4 shows a schematic illustration of a slightly modified embodiment of the second section as per FIG. 3.

FIG. 4 shows the second section of the particle beam device 1 as per FIG. 3, but in a different operating mode than in FIG. 3. Hence the same components have been provided with the same reference sign. FIG. 4 shows the particle beam device 1 in STEM operation. The third condenser apparatus 35 forms the crossover CO2 in an input image plane 45 of the single-field condenser-objective lens 38 such that a greatly demagnified image of the crossover CO1 or CO2 is created on the object 39. This demagnified image is moved in the object plane 42 by the deflection system 41. The aperture of the electron beam is delimited by an aperture unit 48. The dimensions on the object 39 of the electron beam scanning the object 39 can be modified by different actuation of the first condenser apparatus 33 and the second condenser apparatus 34.

Figure 5:
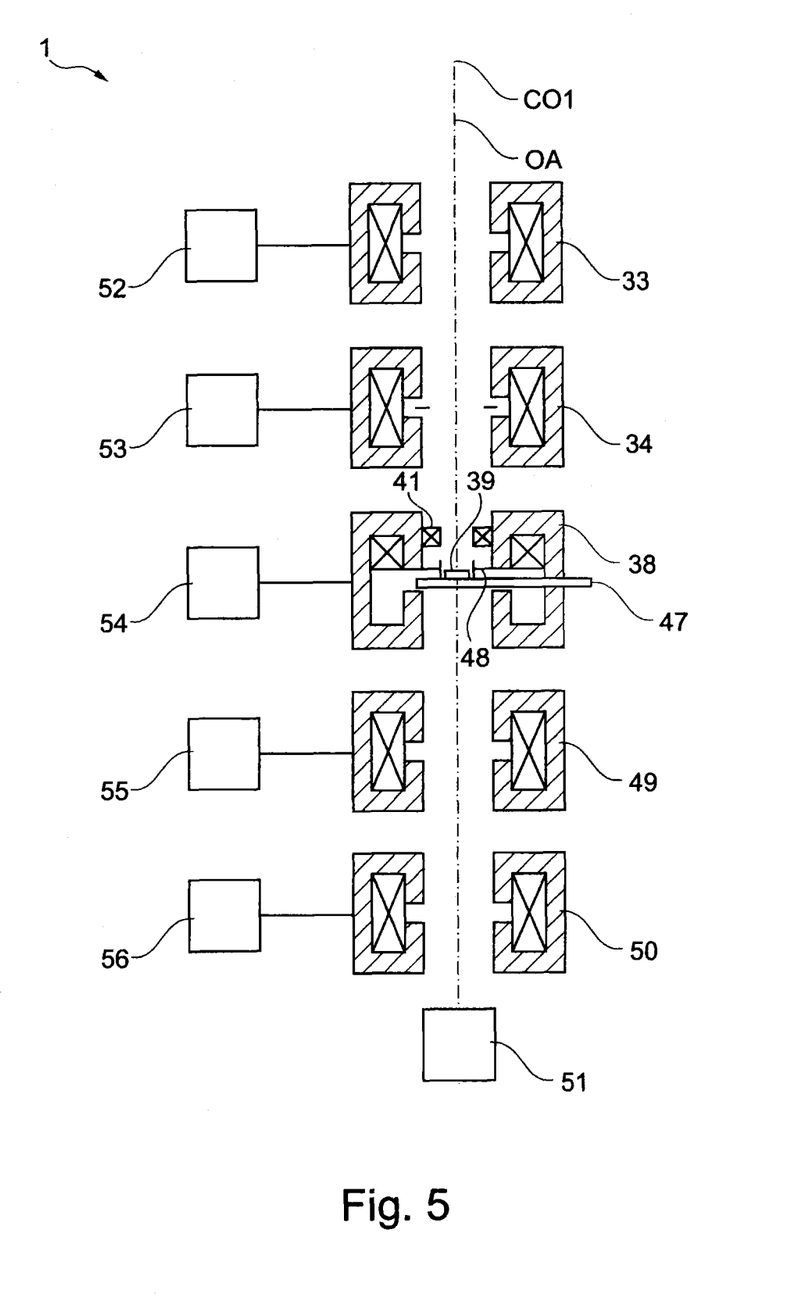
FIG. 5 shows a schematic illustration of a further embodiment of a second section of the particle beam device according to FIG. 1.

FIG. 5 shows a further exemplary embodiment of the second section of the particle beam device 1. The same components have been provided with the same reference sign as in FIG. 4. In this exemplary embodiment there is a condenser unit with a first condenser apparatus 33 and with a second condenser apparatus 34. Arranged downstream of the second condenser apparatus 34 there is a single-field condenser-objective lens 38. A specimen holder 47 with an object 39 to be analyzed is arranged in the single-field condenser-objective lens 38. Furthermore, there is a deflection system 41 in the vicinity of the single-field condenser-objective lens 38. Moreover, there is an aperture unit 48 in the vicinity of the single-field condenser-objective lens 38. Arranged downstream of the single-field condenser-objective lens 38 and along the optical axis OA there are a first projection stage 49, a second projection stage 50 and a detector 51.

The individual aforementioned elements are controlled and supplied using control units. Hence the first condenser apparatus 33 is actuated and supplied using a first control unit 52. For the second condenser apparatus 34 there is a second control unit 53 for controlling and supplying the second condenser apparatus 34. The single-field condenser-objective lens 38 is actuated and supplied using a third control unit 54. There is a fourth control unit 55 for the first projection stage 49. Furthermore, the second projection stage 50 is controlled and supplied using a fifth control unit 56.

In the exemplary embodiment illustrated here, the single-field condenser-objective lens 38 has a fixedly predetermined excitation that is independent of a set magnification of the image. In order to generate a very small diameter of the electron beam for a STEM mode, there can be a suitable modification of the excitation of the first condenser apparatus 33 and the second condenser apparatus 34. The magnification in the STEM mode is determined by the deflection system 41. In normal TEM operation (i.e. no STEM operation), the change in the scale of the object 39 on the detector 51 is brought about by actuating the first projection stage 49 and the second projection stage 50. Moreover, it is possible to set different illumination fields and illumination apertures on the object 39 using the second section of the particle beam device 1, illustrated in FIG. 5, with the aid of the first condenser apparatus 33 and the second condenser unit 34 and the pre-field lens unit 43.

Figure 6:
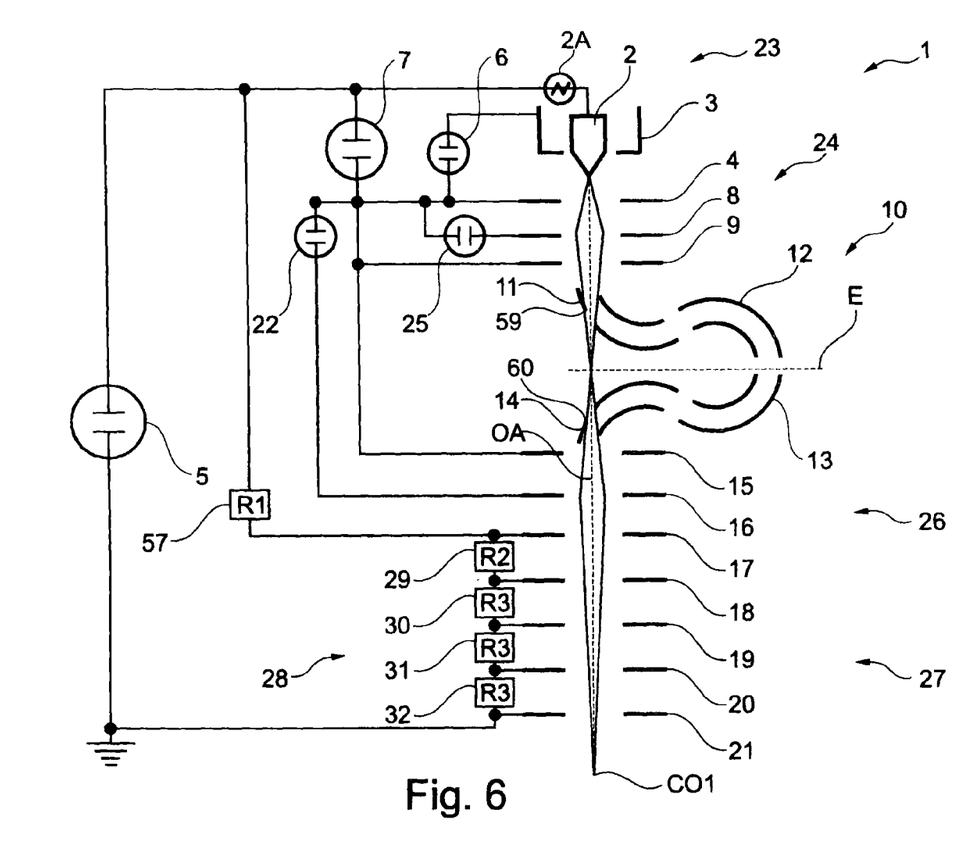
FIG. 6 shows a schematic illustration of a further embodiment of a first section of a particle beam device in the form of a TEM.

FIG. 6 shows a schematic illustration of a further exemplary embodiment of a first section of the particle beam device 1. The exemplary embodiment of FIG. 6 is based on the exemplary embodiment of FIG. 1. Therefore the same components are provided with the same reference sign. The exemplary embodiment in FIG. 6 only differs from the exemplary embodiment in FIG. 1 to the extent that the monochromator unit 10 has a first opening 59 and a second opening 60. The monochromator unit 10 in the exemplary embodiment of FIG. 6 can firstly be operated like the exemplary embodiment as per FIG. 1. Secondly, it is possible to switch off the monochromator unit 10 of the exemplary embodiment of FIG. 6. In this case, the electron beam generated by the electron emitter 2 passes through the first opening 59 and the second opening 60. In principle, the electron beam runs along the optical axis OA of the particle beam device 1 as if the monochromator unit 10 were not present in the particle beam device 1. In this case, it is also possible to operate the first electrode unit 24 and the second electrode unit 26 in a zoom mode. In the process, the diameter of the crossover CO1 can be modified by varying the second potential of the second electrode apparatus 8 and by varying the third potential of the fifth electrode apparatus 16 when a position of the crossover CO1 is kept fixed.

Figure 7:
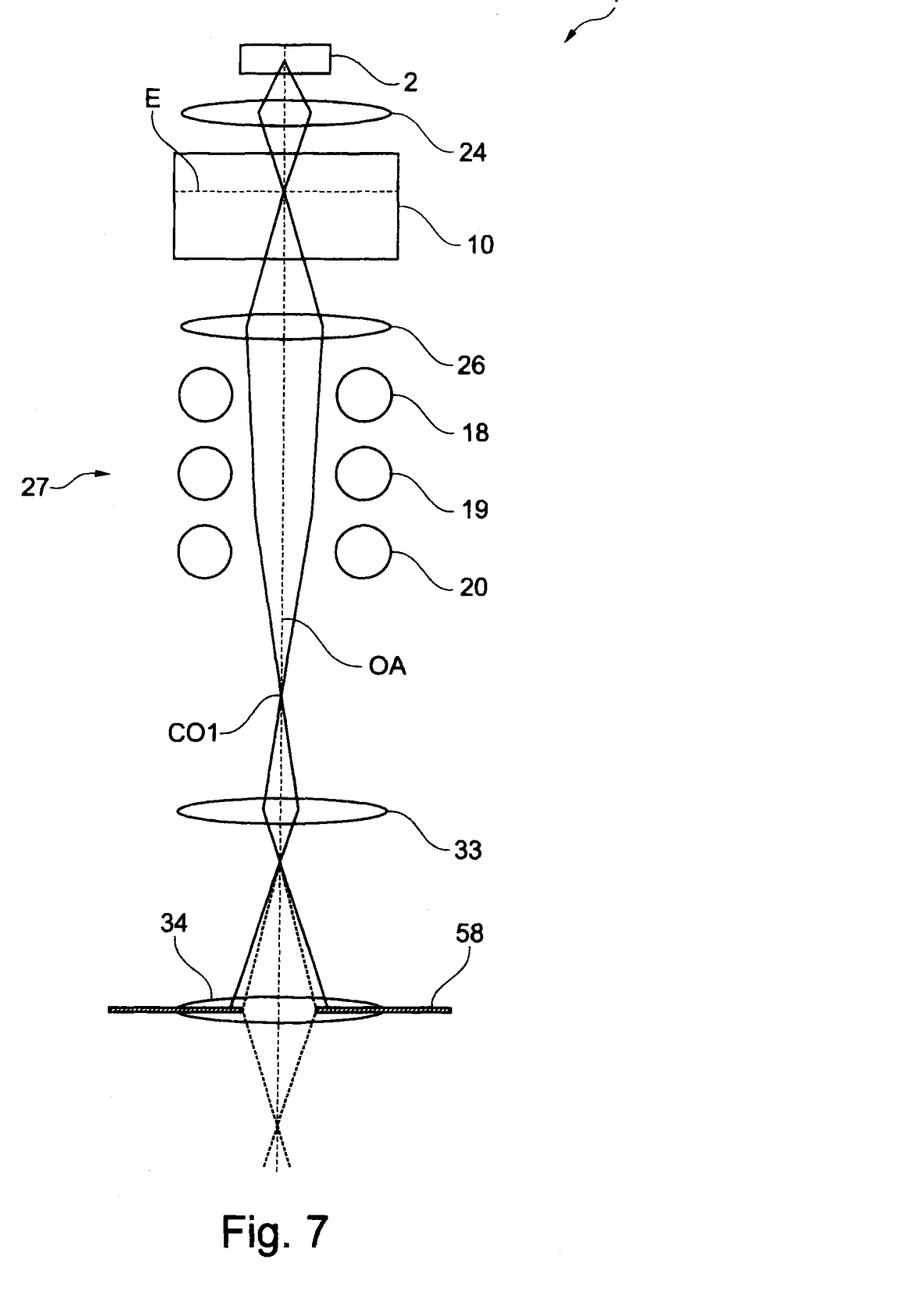
FIG. 7 shows a schematic illustration of the first section of the particle beam device with a two-stage condenser unit according to an embodiment of the system described herein.
Figure 8:
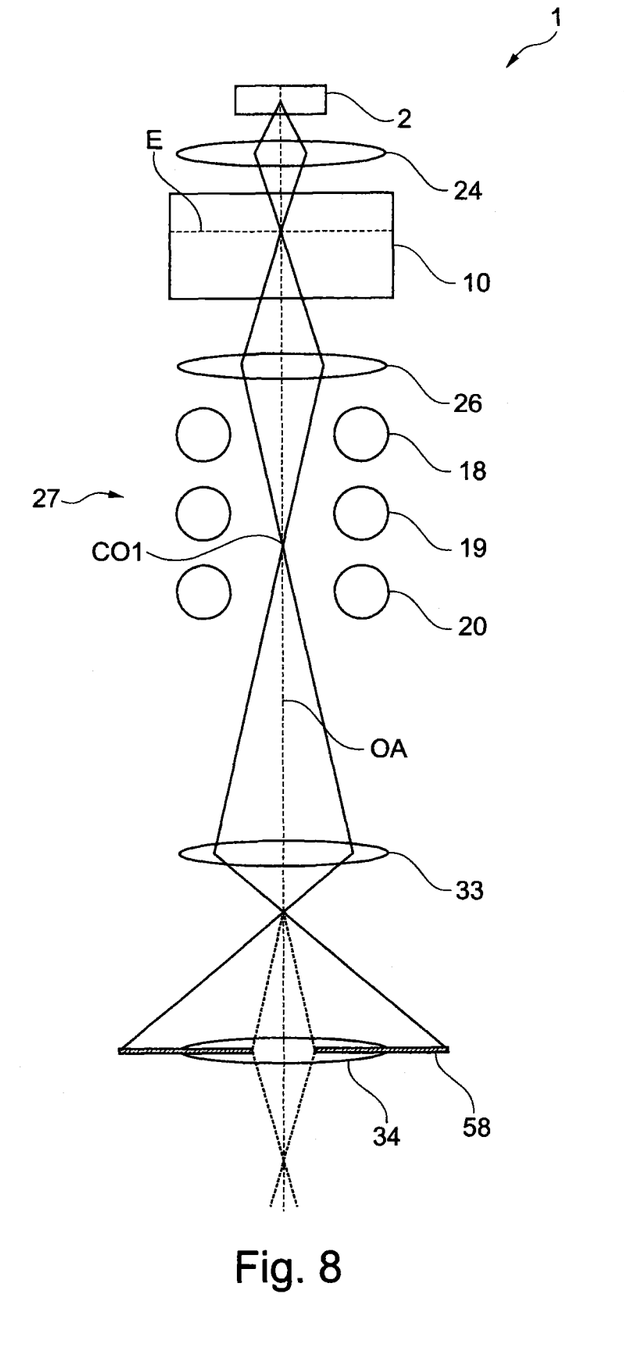
FIG. 8 shows a further schematic illustration of the first section of the particle beam device with the two-stage condenser unit according to an embodiment of the system described herein.

FIGS. 7 and 8 show simplified schematic illustrations of the particle beam device 1 according to FIG. 1 or FIG. 6. The same components have been provided with the same reference sign. Hence FIGS. 7 and 8 show the electron emitter 2, the first electrode unit 24, the monochromator unit 10 with the plane E, the second electrode unit 26, the acceleration unit 27 (however, only with the second acceleration apparatus 18, the third acceleration apparatus 19 and the fourth acceleration apparatus 20), the first condenser apparatus 33 and the second condenser apparatus 34. Additionally, FIGS. 7 and 8 show an aperture unit 58, which is arranged on the second condenser apparatus 34.

In the following text, the beam path of the electron beam is described in more detail, wherein this beam path can occur in the exemplary embodiment as per FIG. 1 and/or in the exemplary embodiment as per FIG. 6. In principle, FIGS. 7 and 8 describe adjustment options of a condenser system. A corresponding excitation of the second electrode unit 26 allows positioning of the crossover CO1 along the optical axis OA such that a very large number of electrons can pass through the aperture unit 58. By way of example, the crossover CO1 is placed between the acceleration unit 27 and the first condenser apparatus 33 (cf. FIG. 7). As a result many electrons pass through the aperture unit 58 and a large electron current is routed to an object to be analyzed. This embodiment is suitable for high-current applications, for example for analytic imaging and high-resolution TEM examinations. FIG. 8 shows another application. The second electrode unit 26 can be excited such that the crossover CO1 is displaced in the direction of the electron emitter 2, for example in the region of the acceleration unit 27. On the one hand, compared to FIG. 7, this lets fewer electrons pass through the aperture unit 58 in the direction of an object to be analyzed. On the other hand, this reduces the aperture angle of the beam cone of the electron beam that impinges on the object. This also reduces possible aberrations and supports the formation of an electron beam with a small diameter. The beam path illustrated in FIG. 8 thus for example is suitable for scanning transmission electron microscope imaging (STEM imaging).

In conclusion, it should be stated that the system described herein allows an arbitrary position adjustment of a crossover along the optical axis OA or along the propagation direction of the electron beam, more particularly in a region between the acceleration unit 27 and the first condenser apparatus 33, and this is possible for any desired electron energy (and hence for any possible high voltage) and for any setting of the extractor voltage. This effect is obtained in particle beam devices with or without the above-described monochromator unit. Moreover, it is possible to vary in a suitable fashion the electron beam routed to an object to be analyzed by arbitrary obtainable positions of the crossover.

Various embodiments discussed herein may be combined with each other in appropriate combinations in connection with the system described herein. Additionally, in some instances, the order of steps in the flowcharts, flow diagrams and/or described flow processing may be modified, where appropriate. Further, various aspects of the system described herein may be implemented using software, hardware, a combination of software and hardware and/or other computer-implemented modules or devices having the described features and performing the described functions. Software implementations of the system described herein may include executable code that is stored in a computer readable medium and executed by one or more processors. The computer readable medium may include a computer hard drive, ROM, RAM, flash memory, portable computer storage media such as a CD-ROM, a DVD-ROM, a flash drive and/or other drive with, for example, a universal serial bus (USB) interface, and/or any other appropriate tangible or non-transitory computer readable medium or computer memory on which executable code may be stored and executed by a processor. The system described herein may be used in connection with any appropriate operating system.

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

What is claimed is:

1. A particle beam device for analyzing or treating an object, comprising:
   an optical axis;
   at least one particle beam generator for generating a particle beam;
   at least a first electrode unit, the first electrode unit including at least a first electrode apparatus, at least a second electrode apparatus, and at least a third electrode apparatus, wherein, arranged in the direction of an object, starting from the particle beam generator along the optical axis, firstly is the first electrode apparatus, subsequently is the second electrode apparatus, and again subsequently is the third electrode apparatus, wherein the first electrode apparatus lies at a first potential and extracts particles from the particle beam generator, wherein the second electrode apparatus lies at a variable second potential, and wherein the third electrode apparatus lies at the first potential;
   at least a second electrode unit, the second electrode unit including at least a fourth electrode apparatus, at least a fifth electrode apparatus, and at least a sixth electrode apparatus, wherein, arranged in the direction of an object, starting from the third electrode apparatus along the optical axis, firstly is the fourth electrode apparatus, subsequently is the fifth electrode apparatus, and again subsequently is the sixth electrode apparatus, wherein the fourth electrode apparatus lies at the first potential, and wherein the fifth electrode apparatus lies at a variable third potential; and
   at least one acceleration unit for accelerating the particle beam, the acceleration unit including at least a first acceleration apparatus and at least a second acceleration apparatus, wherein, arranged in the direction of an object, starting from the second electrode unit along the optical axis, firstly is the first acceleration apparatus, and subsequently is the second acceleration apparatus, wherein the first acceleration apparatus lies at a fourth potential, and wherein the second acceleration apparatus lies at a fifth potential,
   wherein the first electrode unit generates a first crossover of the particle beam and the second electrode unit generates a second crossover of the particle beam, wherein, via selection of the variable second potential, the first electrode unit focuses the particle beam onto a specific geometrically fixed plane of the first crossover, and wherein, via selection of the variable third potential, the fifth electrode apparatus, lying at the variable third potential, focuses the particle beam on a predeterminable point on the optical axis and positions the second crossover of the particle beam on the optical axis wherein a position of the second crossover is adjustable independently of an overall voltage of the at least one acceleration unit and the first potential.

2. The particle beam device according to claim 1, wherein at least one of the following features is provided:
   (i) the first acceleration apparatus is the sixth electrode apparatus; or
   (ii) the sixth electrode apparatus lies at a variable sixth potential.

3. The particle beam device according to claim 1, further comprising:
   at least one monochromator unit, the monochromator unit including at least a first monochromator electrode apparatus and at least a second monochromator electrode apparatus, wherein, arranged in the direction of an object, starting from the first electrode unit along the optical axis, firstly is the first monochromator electrode apparatus and subsequently is the second monochromator electrode apparatus.

4. The particle beam device according to claim 3, wherein at least one of the following features is provided:
   (i) the third electrode apparatus is a monochromator input electrode, or
   (ii) the fourth electrode apparatus is a monochromator output electrode.

5. The particle beam device according to claim 1, wherein at least one of: the fourth potential of the first acceleration apparatus, or the fifth potential of the second acceleration apparatus is configured to be variable.

6. The particle beam device according to claim 1, wherein the acceleration unit further includes at least a third acceleration apparatus, at least a fourth acceleration apparatus, and at least a fifth acceleration apparatus, wherein, arranged in the direction of an object, starting from the first acceleration apparatus along the optical axis, firstly is the third acceleration apparatus, subsequently is the fourth acceleration apparatus, and again subsequently is the fifth acceleration apparatus, wherein the third acceleration apparatus lies at a seventh potential, wherein the fourth acceleration apparatus lies at an eighth potential and wherein the fifth acceleration apparatus lies at a ninth potential.

7. The particle beam device according to claim 6, wherein at least one of the following features is provided:
   (i) the seventh potential is configured to be variable;
   (ii) the eighth potential is configured to be variable; or
   (iii) the ninth potential is configured to be variable.

8. The particle beam device according to claim 1, further comprising at least one of:
   (i) at least one adjustable high-voltage supply unit; or
   (ii) at least one adjustable resistor unit.

9. The particle beam device according to claim 1, further comprising:
   at least one condenser unit, wherein the condenser unit includes one of the following features:
   (i) at least a first condenser apparatus and at least a second condenser apparatus;
   (ii) at least a first condenser apparatus, at least a second condenser apparatus and at least a third condenser apparatus; or
   (iii) at least a first condenser apparatus, at least a second condenser apparatus, at least a third condenser apparatus and at least a fourth condenser apparatus.

10. The particle beam device according to claim 9, wherein at least one of the following features is provided:
    (i) the condenser unit forms the particle beam parallely to the optical axis;
    (ii) the condenser unit adjusts an illumination field; or
    (iii) the condenser unit adjusts an illumination aperture.

11. The particle beam device according to claim 1, wherein the first electrode apparatus is an extractor electrode apparatus.

12. The particle beam device according to claim 1, wherein the positioning of the second crossover is carried out independently of an overall voltage of the acceleration unit and the first potential.

13. The particle beam device according to claim 1, wherein the acceleration unit further includes additional acceleration apparatuses, wherein a potential difference between the fourth electrode apparatus and the first acceleration apparatus and a potential difference between the first acceleration apparatus and the second acceleration apparatus are less than any potential differences between the additional acceleration apparatuses.

14. A method for analyzing or treating an object using a particle beam device, the particle beam device including:
    an optical axis;
    at least one particle beam generator for generating a particle beam;
    at least a first electrode unit, the first electrode unit including at least a first electrode apparatus, at least a second electrode apparatus, and at least a third electrode apparatus, wherein, arranged in the direction of an object, starting from the particle beam generator along the optical axis, firstly is the first electrode apparatus, subsequently is the second electrode apparatus, and again subsequently is the third electrode apparatus, wherein the first electrode apparatus lies at a first potential and extracts particles from the particle beam generator, wherein the second electrode apparatus lies at a variable second potential, and wherein the third electrode apparatus lies at the first potential;
    at least a second electrode unit, the second electrode unit including at least a fourth electrode apparatus, at least a fifth electrode apparatus, and at least a sixth electrode apparatus, wherein, arranged in the direction of an object, starting from the third electrode apparatus along the optical axis, firstly is the fourth electrode apparatus, subsequently is the fifth electrode apparatus, and again subsequently is the sixth electrode apparatus, wherein the fourth electrode apparatus lies at the first potential and wherein the fifth electrode apparatus lies at a variable third potential; and
    at least one acceleration unit for accelerating the particle beam, the acceleration unit including at least a first acceleration apparatus and at least a second acceleration apparatus, wherein, arranged in the direction of an object, starting from the second electrode unit along the optical axis, firstly is the first acceleration apparatus, and subsequently is the second acceleration apparatus, wherein the first acceleration apparatus lies at a fourth potential, and wherein the second acceleration apparatus lies at a fifth potential;
    the method comprising:
    generating a particle beam using the particle beam generator;
    focusing the particle beam in a plane perpendicular to the optical axis or onto the optical axis using the first electrode unit by selecting the second potential; and
    focusing the particle beam on a predeterminable point on the optical axis by selecting the third potential,
    wherein the first electrode unit generates a first crossover of the particle beam and the second electrode unit generates a second crossover of the particle beam, wherein the first electrode unit, via selection of the variable second potential., focuses the particle beam onto a specific geometrically fixed plane of the first crossover, and wherein the fifth electrode apparatus, via selection of the variable third potential and with the fifth electrode apparatus lying at the variable third potential, focuses the particle beam on the predeterminable point on the optical axis and positions the second crossover of the particle beam on the optical axis wherein a position of the second crossover is adjustable independently of an overall voltage of the at least one acceleration unit and the first potential.

15. The method according to claim 14, wherein at least one of the following features is provided:
    (i) the first acceleration apparatus is the sixth electrode apparatus; or
    (ii) the sixth electrode apparatus lies at a variable sixth potential.

16. The method according to claim 14, further comprising:
    arranging at least one monochromator unit, the monochromator unit including at least a first monochromator electrode apparatus and at least a second monochromator electrode apparatus, wherein, arranged in the direction of an object, starting from the first electrode unit along the optical axis, firstly is the first monochromator electrode apparatus and subsequently is the second monochromator electrode apparatus.

17. The method according to claim 16, wherein at least one of the following features is provided:
    (i) the third electrode apparatus is a monochromator input electrode, or
    (ii) the fourth electrode apparatus is a monochromator output electrode.

18. The method according to claim 14, wherein at least one of: the fourth potential of the first acceleration apparatus, or the fifth potential of the second acceleration apparatus is configured to be variable.

19. The particle beam device according to claim 14, wherein the acceleration unit further includes at least a third acceleration apparatus, at least a fourth acceleration apparatus, and at least a fifth acceleration apparatus, wherein, arranged in the direction of an object, starting from the first acceleration apparatus along the optical axis, firstly is the third acceleration apparatus, subsequently is the fourth acceleration apparatus, and again subsequently is the fifth acceleration apparatus, wherein the third acceleration apparatus lies at a seventh potential, wherein the fourth acceleration apparatus lies at an eighth potential and wherein the fifth acceleration apparatus lies at a ninth potential.

20. The method according to claim 19, wherein at least one of the following features is provided:
    (i) the seventh potential is configured to be variable;
    (ii) the eighth potential is configured to be variable; or
    (iii) the ninth potential is configured to be variable.

21. The method according to claim 14, further comprising at least one of:
    (i) providing at least one adjustable high-voltage supply unit; or
    (ii) providing at least one adjustable resistor unit.

22. The method according to claim 14, further comprising:
    providing at least one condenser unit, wherein the condenser unit includes one of the following features:
    (i) at least a first condenser apparatus and at least a second condenser apparatus;
    (ii) at least a first condenser apparatus, at least a second condenser apparatus and at least a third condenser apparatus; or
    (iii) at least a first condenser apparatus, at least a second condenser apparatus, at least a third condenser apparatus and at least a fourth condenser apparatus.

23. The method according to claim 22, wherein at least one of the following features is provided:
(i) the condenser unit forms the particle beam parallely to the optical axis;
(ii) the condenser unit adjusts an illumination field; or
(iii) the condenser unit adjusts an illumination aperture.

24. The method according to claim 14, wherein the first electrode apparatus is an extractor electrode apparatus.

25. The method according to claim 14, wherein the positioning of the second crossover is carried out independently of an overall voltage of the acceleration unit and the first potential.

26. The method according to claim 14, wherein the acceleration unit further includes additional acceleration apparatuses, wherein a potential difference between the fourth electrode apparatus and the first acceleration apparatus and a potential difference between the first acceleration apparatus and the second acceleration apparatus are less than any potential differences between the additional acceleration apparatuses.

* * * * *